(12) United States Patent
Dille et al.

(10) Patent No.: US 12,135,921 B1
(45) Date of Patent: Nov. 5, 2024

(54) GEOSYNTHETIC LINER SEAM MODELING AND REPORTING SYSTEM AND ASSOCIATED METHODS

(71) Applicant: COMANCO Environmental Corporation, Plant City, FL (US)

(72) Inventors: Spencer Everett Dille, Lithia, FL (US); Nicholas Alexander Dille, Jasper, AL (US); Gregory F. Pignataro, Tampa, FL (US); Evan P. Bao, Tampa, FL (US)

(73) Assignee: COMANCO Environmental Corporation, Plant City, FL (US)

( * ) Notice: Subject to any disclaimer, the term of this patent is extended or adjusted under 35 U.S.C. 154(b) by 29 days.

(21) Appl. No.: 17/191,492

(22) Filed: Mar. 3, 2021

Related U.S. Application Data

(60) Provisional application No. 63/027,437, filed on May 20, 2020.

(51) Int. Cl.
  *G06F 30/13* (2020.01)
  *G01S 19/06* (2010.01)
  (Continued)

(52) U.S. Cl.
  CPC ............. *G06F 30/13* (2020.01); *G01S 19/06* (2013.01); *G06T 17/005* (2013.01); *G06T 17/05* (2013.01)

(58) Field of Classification Search
  CPC ....... G06F 30/13; G01S 19/06; G06T 17/005; G06T 17/05; G06T 2200/24;
  (Continued)

(56) References Cited

U.S. PATENT DOCUMENTS

| 6,155,117 A | 12/2000 | Stevens et al. |
| 2004/0010342 A1 | 1/2004 | Thelen |

(Continued)

OTHER PUBLICATIONS

"Comanco is Quality: Part 2 'Computer Aided As-Built -Caab™'" posted on Oct. 9, 2018, retrieved from https://comanco.com/blog/comanco-uses-caab-program-to-gather-real-time-analytics/ on Dec. 1, 2022 (Year: 2018).*

(Continued)

*Primary Examiner* — Rehana Perveen
*Assistant Examiner* — Troy A Maust
(74) *Attorney, Agent, or Firm* — John Rizvi; John Rizvi, P.A.—The Patent Professor

(57) ABSTRACT

A Geosynthetic Liner Seam Modeling and Reporting System configured to capture Global Positioning System (GPS) points shot on geomembrane liner seams and to automatically create a three-dimensional (3D) as-built software model based on those GPS points. Each GPS point(s) need only be captured along the liner seam where a change(s) in direction from a straight line is detected on the seam. The system provides for tagging of each GPS point with identifiers for adjacent panels to each specific point. The system also supports sizing of the seamed panels of the as-built geomembrane structure based on the captured GPS points, results of which are formatted as installation metrics for inclusion in industry standard reports and/or custom reports (e.g., for quality assurance and/or contract adherence purposes).

9 Claims, 10 Drawing Sheets

(51) Int. Cl.
*G06T 17/00* (2006.01)
*G06T 17/05* (2011.01)

(58) Field of Classification Search
CPC . G06T 2207/10032; G06T 2207/30232; G06T 2207/10028
See application file for complete search history.

(56) References Cited

U.S. PATENT DOCUMENTS

| | | |
|---|---|---|
| 2014/0124125 A1 | 5/2014 | Nussbaum et al. |
| 2014/0316614 A1 | 10/2014 | Newman |
| 2017/0259491 A1 | 9/2017 | Ralston et al. |
| 2017/0266868 A1 | 9/2017 | Ralston et al. |
| 2018/0350144 A1* | 12/2018 | Rathod ................ H04W 4/021 |

OTHER PUBLICATIONS

Screen captures from YouTube video "COMANCO Technology", 3 pages, uploaded on Apr. 25, 2017 by user "COMANCO", retrieved from https://www.youtube.com/watch?v=bDZmulYLLWU on Dec. 1, 2022 (Year: 2017).*

Muthukrishnan "Understanding Graham scan algorithm for finding the Convex hull of a set of Points" posted Jan. 26, 2020 and retrieved Dec. 2, 2022 from https://muthu.co/understanding-graham-scan-algorithm-for-finding-the-convex-hull-of-a-set-of-points/ (Year: 2020).*

"Class Arraylist<E>" captured Oct. 10, 2019 from https://docs.oracle.com/javase/8/docs/api/java/util/ArrayList.html, retrieved Dec. 5, 2022 from https://web.archive.org/web/20191010103534/https://docs.oracle.com/javase/8/docs/api/java/util/ArrayList.html (Year: 2019).*

R.L. Graham "An Efficient Algorith for Determining the Convex Hull of a Finite Planar Set", Information Processing Letters 1 (1972) p. 132-133. North-Holland Publishing Company (Year: 1972).*

"GPS-enabled poly welder" at http://polyweldmachinery.com.au/?tag=hdpe.

* cited by examiner

PRIOR ART

Single Hot Wedge

Dual Hot Wedge Seam

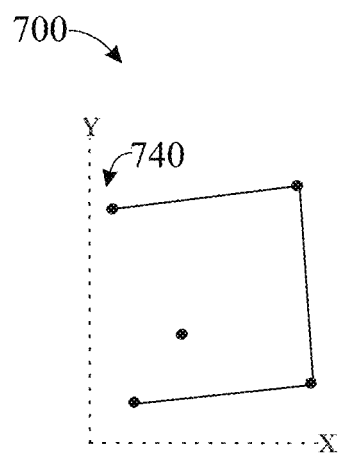
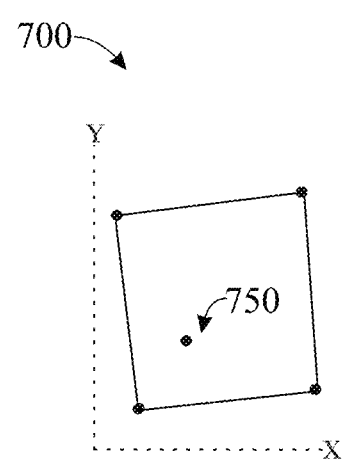
FIG. 7E
FIG. 7F
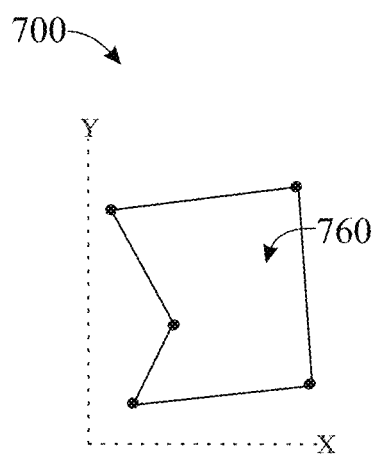
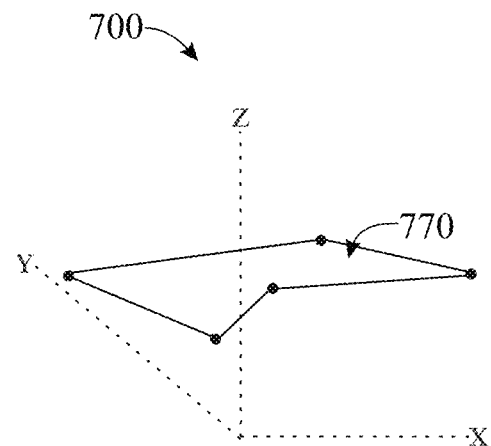
FIG. 7G
FIG. 7H

GEOSYNTHETIC LINER SEAM MODELING AND REPORTING SYSTEM AND ASSOCIATED METHODS

CROSS-REFERENCE TO RELATED APPLICATION

This application claims the benefit of U.S. Provisional Patent Application Ser. No. 63/027,437, filed May 20, 2020, which is incorporated herein in its entirety.

FIELD OF THE INVENTION

The present invention relates generally to geosynthetic liner installation solutions and, more particularly, to methods, systems, and devices for generating and reporting quality assurance and contract performance metrics for a geosynthetic liner installation of interest.

BACKGROUND OF THE INVENTION

Geotechnical engineering may be defined as a specialization within civil engineering that involves predicting the properties and behavior of earth materials present at a site of interest, and designing engineering works complementary to that site to suit human activities and development. Synthetic materials commonly applied in such engineering works (e.g., geosynthetics) may include materials categorized as geotextiles, geogrids, geonets, geomembranes, geosynthetic clay liners, geofoam, geocells, and/or geocomposites. Geosynthetic materials support a wide range of civil, geotechnical, transportation, geoenvironmental, hydraulic, and private development applications including incorporation with earth materials for construction of roads, airfields, railroads, embankments, retaining structures, reservoirs, canals, dams, erosion control, sediment control, landfill liners, landfill covers, mining, aquaculture and agriculture.

As used herein, a geomembrane refers to a low permeability, relatively thin synthetic membrane liner or barrier used in cooperation with an earth material for purposes that may include control of fluid, gas and/or solid migration in a geotechnical-engineered structure or system. Common ways to form and install a geomembrane include cutting a working section of material from a single polymeric sheet, or assembling two or more polymeric sheets (referred to herein as "panels") to form the working section. When multiple panels are assembled to form a working section of geomembrane, one of several seaming techniques known in the art is typically applied to the intersection(s) of the panels. Chemical welding and heat welding are the two most common methods of producing seams in geomembrane fabrication.

Referring now to FIG. 1, a known heat welding technique example is described in detail. As illustrated, hot wedge seaming 100 refers to a thermal technique that involves applying a heated element 110 (e.g., hot metal wedge or knife) between two geomembrane surfaces 120, 130 to be seamed to create a shear melting flow across the upper and lower surfaces of the element 110. Pressure may then be applied (e.g., using a squeeze roller device 140) to the top 120 and/or bottom 130 geomembrane(s) to form a continuous bond between the two materials. Referring additionally to FIG. 2, hot wedge seaming may result in typical hot wedge seams 200 that may present as a single bond track 210, or that may present as dual bond tracks 230, 240 separated by a nonbonded gap 250 (the latter seam type referred to as a dual hot wedge seam or double-track seam).

In addition to seaming, geomembrane fabrication often requires patching (e.g., to repair holes, tears, undispersed raw materials and/or contamination by foreign matter). Extrusion welding is a common finishing technique for such geomembrane repair, and typically involves introduction of a ribbon of molten resin (also referred to as a "welded bead") along the edge of the overlap of two geomembrane sheets to be welded. An extrusion weld is then produced using a welding rod manufactured from the same material used to produce the liner. A hot air preheat and the addition of molten polymer causes some of the material of each geomembrane sheet to be liquified, resulting in a homogeneous bond between the molten weld bead and the surfaces of the overlapped sheets.

Because geotechnical engineering projects involving fabricating seamed and/or repaired geomembranes must strike a compatible balance between human activities and the ability of natural systems to support and nurture life, construction quality control and construction quality assurance are paramount. Unfortunately, this strictly regulated field still suffers from antiquated methods of quality management and of contract compliance. Both activities routinely require as-built drawings of a geomembrane installation to support requirements verification and standards adherence. Current industry practice typically is to engage an inspector to quality check geomembrane installations. Too often, however, industry owners and/or inspectors rely on hand-drawn and/or hand-collected data to manage and/or vet multimillion-dollar construction projects that may lead to environmental repercussions (and fines) if not done properly. Many in the industry still rely on wheeling to measure the individual panels for quantity verification and/or for billing.

An enabling technology for weld data tracking solutions that has been the subject of more recent research involves exploitation of satellite communication capabilities, such as Global Positioning System (GPS) services. However, latency poses a significant challenge to making use of wireless communication with satellites to monitor and/or facilitate activities on earth's surface. As used herein, latency is defined as the time taken for information to pass from an origin to a destination and, potentially, for a response to return. Predictably, latency increases as orbit distances increase. As shown in the example orbit comparison schematic 300 of FIG. 3 (expressing example orbit distances from earth in miles), geosynchronous (GEO) satellites 310 orbit the earth at approximately 36,000 kilometers above the equator. Medium-earth orbit (MEO) satellites 320 orbit the earth at an approximate altitude of 8,068 kilometers. Low-earth orbit (LEO) satellites 330 orbit the earth at approximate altitudes between 780 kilometers and 1,414 kilometers. Therefore, LEO satellites hold particular promise for uses involving activities occurring on earth's surface. For example, a stated purpose of large constellations of LEO satellites is to achieve constant 100% global broadband internet coverage.

The following are examples of known weld data tracking solutions that may incorporate various satellite-based functionalities:

U.S. Patent Application No. 2017/0266868 (Ralston et al.) appears to disclose a moveable seam welding machine equipped with a sensor configured to generate geolocation coordinates for a point along a weld seam that may be monitored for abnormalities or anomalies. The geolocation coordinates for the data point may be plotted or registered overtop satellite imagery.

"GPS-Based Seam Data Sharing," as published at the webpage posted at https://www.geosynthetica.com/Aeistergps-based-geosynthetic-welders, appears to disclose a moveable seam welding machine equipped with wireless data sharing as part of a geosynthetic installation quality system. The GPS-based technology enables installers to record primary weld parameters and generate enhanced reports.

Both of these referenced designs seem to merely employ satellite communication for simple data collection and reporting (e.g., for individual seam integrity analysis, and for identification of weak points in a seam based on heat, pressure, and/or speed). Despite these designs' built-in GPS capabilities, neither includes a means, for example, of generating a working as-built drawing.

Accordingly, there is a need for a solution to at least one of the aforementioned problems. For instance, there is an established need for a geosynthetic liner seam quality assurance solution that effectively and affordably provides precise GPS-coordinated as-built modeling and also seam control and repair reporting with minimal required user data input.

SUMMARY OF THE INVENTION

The present invention is directed to devices, systems, and processes for capturing GPS points shot on geomembrane liner seams and automatically creating a three-dimensional (3D) as-built software model based on those GPS points. In the present invention design, GPS point(s) need only be captured along the liner seam where a change(s) in direction from a straight line is detected on the seam. Embodiments of the invention may tag each GPS point with identifiers for those panels adjacent to each specific point. After all the GPS points are shot and tagged with the associated adjacent panel numbers, the present invention may algorithmically create a 3D drawing (e.g., model) of the geolocation of all the panels present in a completed, as-built geomembrane structure. From this as-built model, results of sizing of the seamed panels of the as-built geomembrane structure may be formatted as installation metrics for inclusion in industry standard reports and/or custom reports (e.g., for quality assurance and/or contract adherence purposes).

In a first implementation of the invention, a geosynthetic liner seam monitoring and reporting system comprises:
a communication subsystem configured to receive, for a geomembrane seam, at least one geolocation parameter, and
associate the at least one geolocation parameter to an adjacent panel, defined as an associated panel;
a quantification subsystem configured to
create, using the at least one geolocation parameter and the associated panel, an as-built model of the geosynthetic liner; and
a reporting subsystem configured to
create a report including the as-built model.

In another aspect, at least one of the subsystems are configured to:
capture a GPS points shot on geomembrane liner seams and automatically create a three-dimensional as-built software model based on those GPS points.

In another aspect, GPS point(s) need only be captured along a liner seam where a change(s) in direction from a straight line is detected on the seam.

In another aspect, at least one of the subsystems are configured to:
tag each GPS point with identifiers for those panels adjacent to each specific point.

In another aspect, after all the GPS points are shot and tagged with the associated adjacent panel numbers, the system creates a 3D drawing of a geolocation of all the panels present in a completed, as-built geomembrane structure.

In another aspect, from the as-built model, results of sizing of the seamed panels of the as-built geomembrane structure are formatted as installation metrics for inclusion in industry standard reports and/or custom reports for quality assurance and/or contract adherence purposes.

As another example, disclosed is a geosynthetic liner seam monitoring and reporting system comprising: a communication subsystem configured to receive one or more geolocation parameters related to a geomembrane seam, and
associate the one or more geolocation parameters to one or more adjacent panels within a geosynthetic liner;
a quantification subsystem configured to
create from the one or more geolocation parameters and their associated panels a three-dimensional as-built model of the geosynthetic liner; and
a reporting subsystem configured to
create a report including the 3D as-built model, and
wherein GPS point(s) need only be captured along a liner seam where a change(s) in direction from a straight line is detected on the seam.

In another aspect, a method of generating an as-built model of a multiple-panel, seam-welded membrane comprises creating, for each Panel Group of GPS points, an ordered list of GPS points in counterclockwise order to facilitate drawing of each panel in an xyz coordinate plane by flattening each GPS point to a two-dimensional plane by temporarily removing the z value (elevation).

In another aspect, a method of generating an as-built model of a multiple-panel, seam-welded membrane comprises identifying the GPS point with a lowest y value, defined as an origin point.

In another aspect, a method of generating an as-built model of a multiple-panel, seam-welded membrane comprises determining a smallest angle from the origin point with respect to the x axis to all other GPS points in the Panel Group, in turn, to form among all GPS Points respective segments of the panel to be modeled, defined as a perimeter.

In another aspect, a method of generating an as-built model of a multiple-panel, seam-welded membrane comprises determining, for any GPS point not attached to the perimeter, defined as a respective non-perimeter point, a distance from the non-perimeter point to each nearest segment drawn.

In another aspect, a method of generating an as-built model of a multiple-panel, seam-welded membrane comprises:
splicing, for a respective non-perimeter point that has the smallest distance to a nearest line segment, that non-perimeter point into that nearest line segment and reconnecting the two points associated with the nearest segment, and
reintroducing the respective z values to all GPS points, resulting in an ordered list of GPS points for the Panel Group in counterclockwise order.

In another aspect, a method of generating an as-built model of a multiple-panel, seam-welded membrane comprises
receiving, using a GPS system, GPS points of linear seams of a geomembrane as the linear seams are installed.

In another aspect, a method of generating an as-built model of a multiple-panel, seam-welded membrane comprises tagging each of the GPS points with adjacent panel identifiers, as meta data.

In another aspect, a method of generating an as-built model of a multiple-panel, seam-welded membrane comprises
generating an array list of all panel identifiers and matched data pairs linking each panel identifier with each GPS point defining the matched data pairs.

In another aspect, a method of generating an as-built model of a multiple-panel, seam-welded membrane comprises
ordering the list by panel identifier.

In another aspect, a method of generating an as-built model of a multiple-panel, seam-welded membrane comprises
creating a first treemap using the panel identifier as a key.

In another aspect, a method of generating an as-built model of a multiple-panel, seam-welded membrane comprises
creating a second treemap using the matched data pairs as a key only including matched data pairs with two or more GPS points in the second treemap.

In another aspect, a method of generating an as-built model of a multiple-panel, seam-welded membrane comprises generating the as-built model using the first treemap and the second treemap.

In another example, disclosed is a geosynthetic liner seam monitoring and reporting method, the method comprising.
using a processor, determining a corresponding panel to geolocation parameters, by tracking the geolocation parameters;
capturing liner installation GPS points;
modeling panel perimeters;
capturing and/or recapturing GPS points;
receiving size edits and/or additions;
revising size inputs;
revising GPS points inputs;
sizing an as-built liner defined as seamed panels;
reporting liner installation metrics defined by some quality metrics;
revising a report input; and
receiving report edits and/or additions;
detecting a seam and/or an additional seam;
detecting a direction change;
shooting a GPS point defined by a group of three dimensional coordinate axes;
associating an adjacent panel and/or adding a panel to a group;
detecting more panels; and
updating panel groups;
creating an array list of panel identifier and/or GPS point ID pairs;
grouping by panels defined by creating an array list of GPS points and values;
performing a second mapping to include sets of multiple values;
grouping by combination of sets of values;
incrementally ordering distinct lists of seams; and
determining if a detected seam is a last seam.

These and other objects, features, and advantages of the present invention will become more readily apparent from the attached drawings and the detailed description of the preferred embodiments, which follow.

BRIEF DESCRIPTION OF THE DRAWINGS

The preferred embodiments of the invention will hereinafter be described in conjunction with the appended drawings provided to illustrate and not to limit the invention, where like designations denote like elements, and in which:

FIGS. 7B, 7C, 7D, 7E, 7F, and 7G present respective state diagrams illustrating sequential transition states of the exemplary Panel Perimeter Model implementation of the geosynthetic liner seam modeling and reporting method of FIG. 5;

FIG. 7H presents a state diagram illustrating a final state of the exemplary Panel Perimeter Model implementation of the geosynthetic liner seam modeling and reporting method of FIG. 5;

Like reference numerals refer to like parts throughout the several views of the drawings.

DETAILED DESCRIPTION

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims. Furthermore, there is no intention to be bound by any expressed or implied theory presented in the preceding technical field, background, brief summary or the following detailed description. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

Shown throughout the figures, the present invention is directed toward systems, devices, and associated methods for generating precise, site-calibrated, three-dimensional, GPS-coordinated as-built modeling of geosynthetic liner seams and also seam control and repair reporting with minimal required user data input. The resultant GPS as-built may advantageously be precisely scaled and representative of true installation quantity (a significant improvement over relying on wheeling/measuring of the individual panels for quantity verification for billing), Instead, the present invention design may generate such information much quicker and more accurately.

Certain embodiments of the present invention also may present a cloud-based data collection and analysis platform that generates necessary documentation per project specification. These and other embodiments of the present invention may present an algorithm that uses as-built modeling data to fill in other facets of a geosynthetics contract submittal while making a responsible field technician perform quality control (QC) properly the first time. By design, the algorithm design of the present invention may not allow for a geomembrane installation to be out of project specifications, all but eliminating the need for third-party inspection and making the installation project submittal process more accurate and available for future use at least in part because installation data is digitally captured and manipulated. This or other embodiments of the present invention also may archive those data for subsequent historical metrics analysis.

Figure 1:
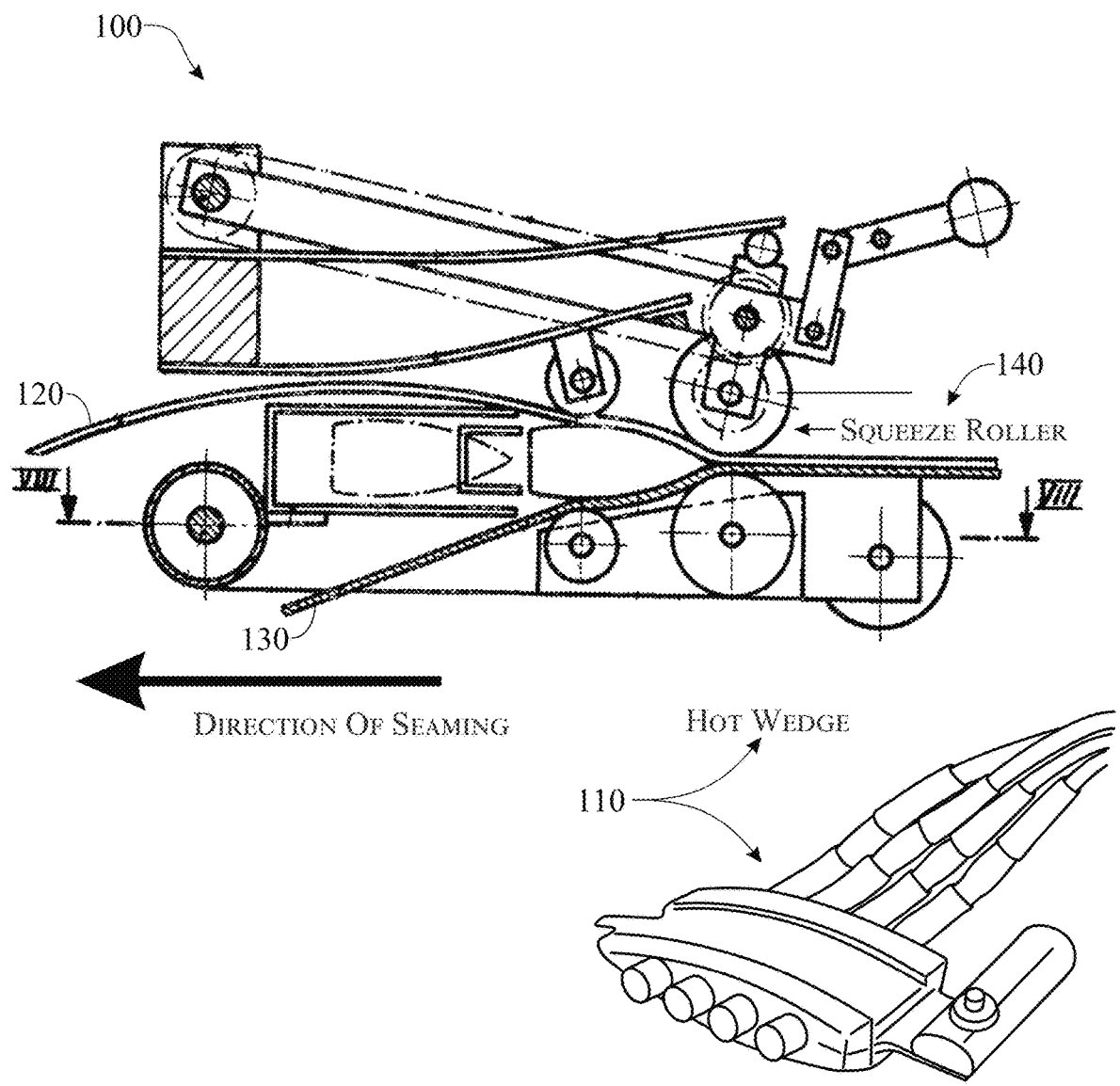
FIG. 1 presents schematic view of an exemplary hot wedge seaming device in operation as known in the prior art.
Figure 2:
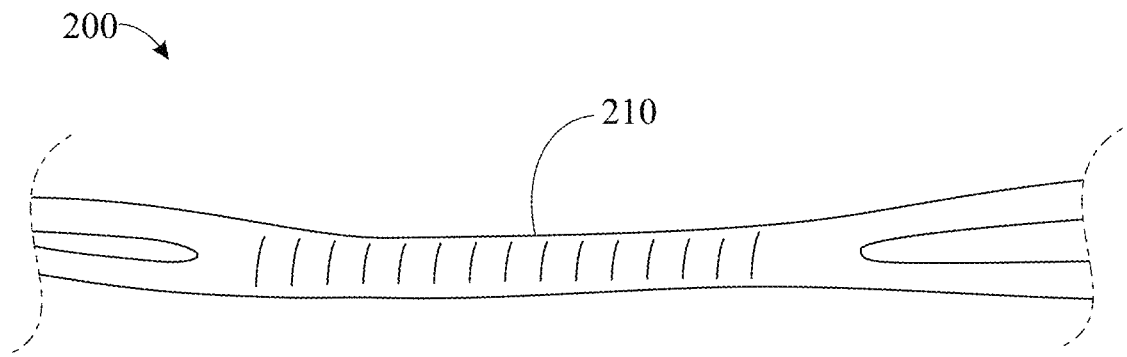
FIG. 2 presents schematic views of exemplary hot wedge seaming techniques as known in the prior art.
Figure 2:
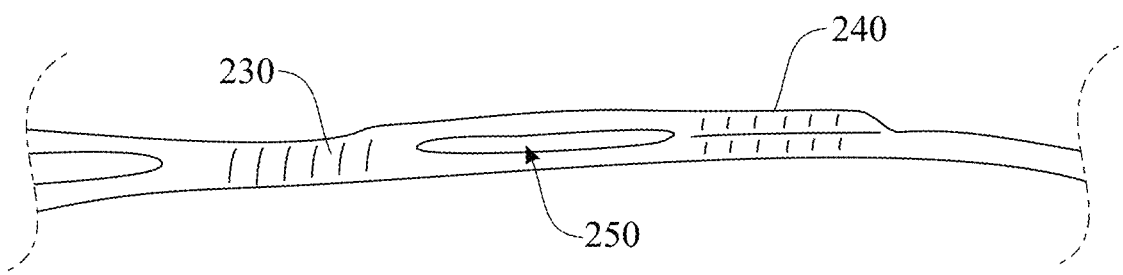
Figure 3:
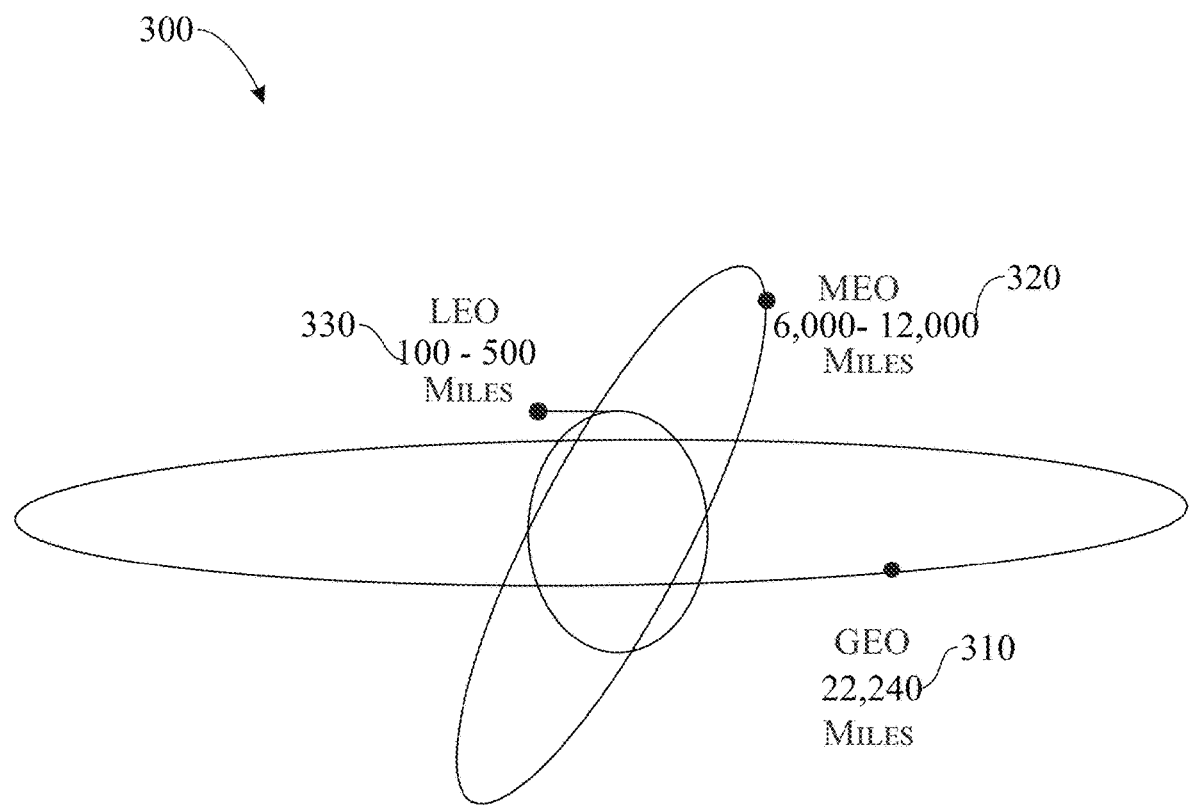
FIG. 3 presents a schematic view of exemplary satellite orbit distances as known in the prior art.
Figure 4:
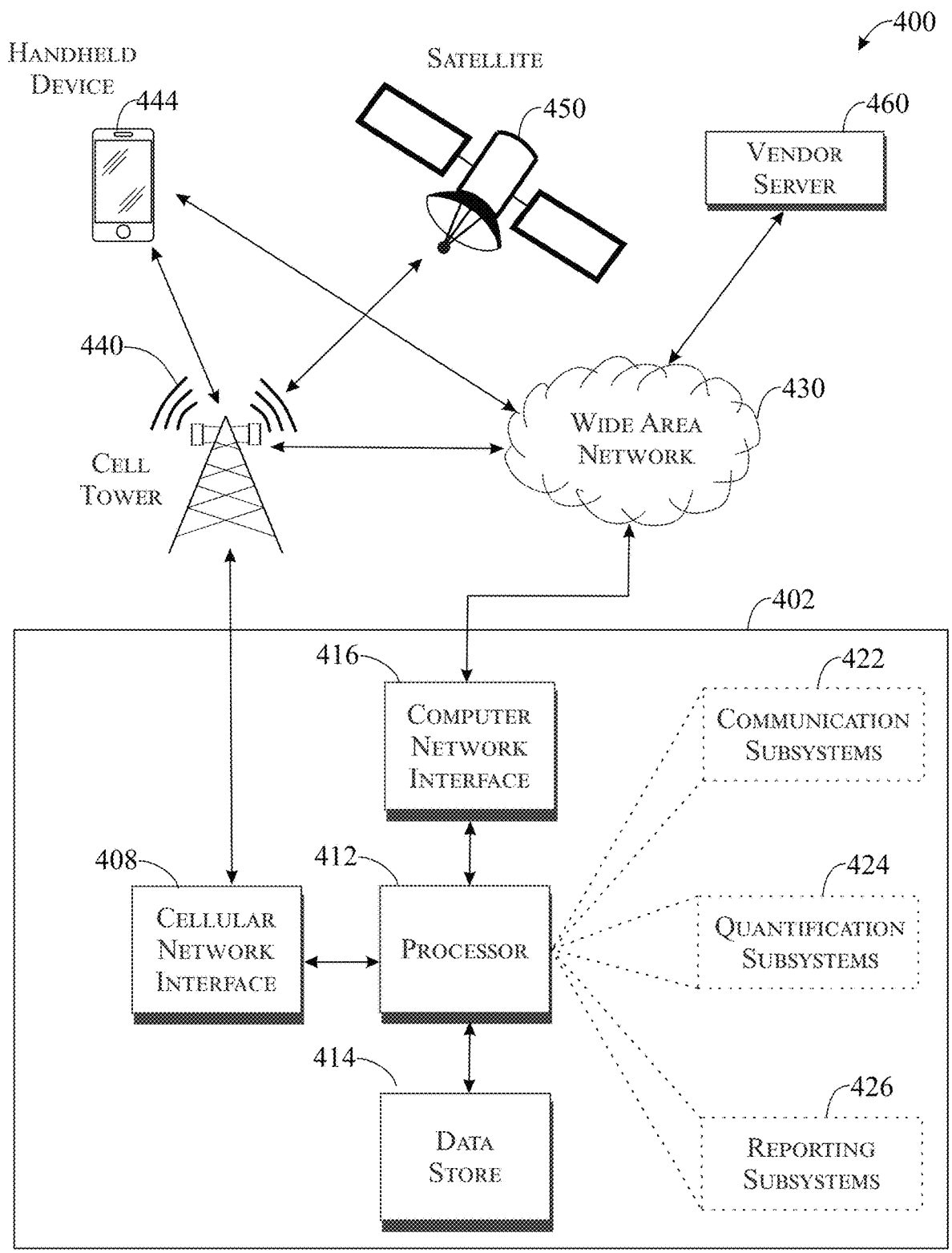
FIG. 4 presents a schematic block diagram of a geosynthetic liner seam modeling and reporting system according to an embodiment of the present invention.

Referring initially to the schematic block diagram of FIG. 4, a Geosynthetic Liner Seam Modeling and Reporting System 400, also referred to as a Geosynthetic Liner Seam Modeling system, a Geosynthetic Liner Seam Reporting system, a Geosynthetic Liner Seam system, or simply as a Geosynthetic Liner Seam service, is illustrated in accordance with an exemplary embodiment of the present invention. Those skilled in the art will understand that the principles of the present disclosure may be implemented on or in data communication with any type of suitably arranged device or system configured to perform Geosynthetic Liner Seam quality assurance, in any combination.

Continuing to refer to FIG. 4, in more detail, a Geosynthetic Liner Seam Modeling and Reporting System controller 402 is illustrated in accordance with an exemplary embodiment of the present invention, comprising a processor 412 that may be operable to accept and execute computerized instructions, and also a data store 414 that may store data and instructions used by the processor 412. More specifically, the processor 412 may be positioned in data communication with some number of the networked devices and may be configured to direct input from such networked devices to the data store 414 for storage and subsequent retrieval. For example, and without limitation, the processor 412 may be in data communication with external wireless network resources, such as a cell towers 440, through a cellular network interface 408. Also for example, and without limitation, the processor 412 may be in data communication with external computing resources, such as a wide area network (WAN) 430, through a computer network interface 416. Furthermore, the processor 412 may be configured to direct input received from components of the WAN 430 and/or the wireless network (e.g., via servicing cell towers 440 and/or some number of geolocation-capable and/or internet-capable satellites 450) to the data store 414 for storage. Similarly, the processor 412 may be configured to retrieve data from the data store 414 to be forwarded as output to various components of the WAN 430 and/or the wireless network.

For example, and without limitation, the computerized instructions of the Geosynthetic Liner Seam Modeling and Reporting System controller 402 may be configured to implement a Communication Subsystem 422, a Quantification Subsystem 424, and/or a Reporting Subsystem 426 that may be stored in the data store 414 and retrieved by the processor 412 for execution. The Communication Subsystem 422 may be operable to receive and transmit geolocation parameters, as well as associated metadata, for terrestrially-positioned geosynthetic liner installations. Such geolocation information, as well as other digital content originating from any number of sources such as low-earth orbit (LEO) satellites 450 and roadside sensors (not shown), may be distributed through the system 400 to and from some number of networked devices including, but not limited to, a Vendor Server 460. For example, and without limitation, executable software on such a Vendor Server 460 may be configured to gather triangulation information from cell towers 440 in the vicinity of a subject geosynthetic liner installation, determine geolocation parameters using a triangulation algorithm, and deliver those geolocation parameters and associated metadata to the Geosynthetic Liner Seam Modeling and Reporting System controller 402 for further processing.

Still referring to FIG. 4, the Quantification Subsystem 424 may be operable to receive geolocation parameters and associated metadata for a geosynthetic liner installation of interest and to determine from those data an as-built model of the subject installation. The Reporting Subsystem 426 may be operable to use the geolocation parameters and/or the as-built model of the subject installation to create industry-standard geosynthetic liner installation reports (e.g., quality, contract) and/or to deliver the same to networked (e.g., cloud-based) print and/or display resources. A person of skill in the art will immediately recognize that an advantageous implementation of the Geosynthetic Liner Seam Modeling and Reporting System controller 402 may employ any or all of the Communication Subsystem 422, the Quantification Subsystem 424, and the Reporting Subsystem 426 collocated upon a single host computing device or distributed among two or more host computing devices. For example, and without limitation, the various components of the Geosynthetic Liner Seam Modeling and Reporting System controller 402 may be implemented on a built-in seaming equipment computing accessory and/or on a smartphone or similar handheld device 444 configured in data communication with a wireless transceiver (such as a cell tower 440).

Those skilled in the art will appreciate that the present disclosure contemplates the use of computer instructions and/or systems configurations that may perform any or all of the operations involved in geosynthetic liner seam installation quality assurance and reporting. The disclosure of computer instructions that include Communication Subsystem 422 instructions, Quantification Subsystem instructions 424, and Reporting Subsystem 426 instructions is not meant to be limiting in any way. Those skilled in the art will readily appreciate that stored computer instructions and/or systems configurations may be configured in any way while still accomplishing the many goals, features and advantages according to the present disclosure.

Figure 5:
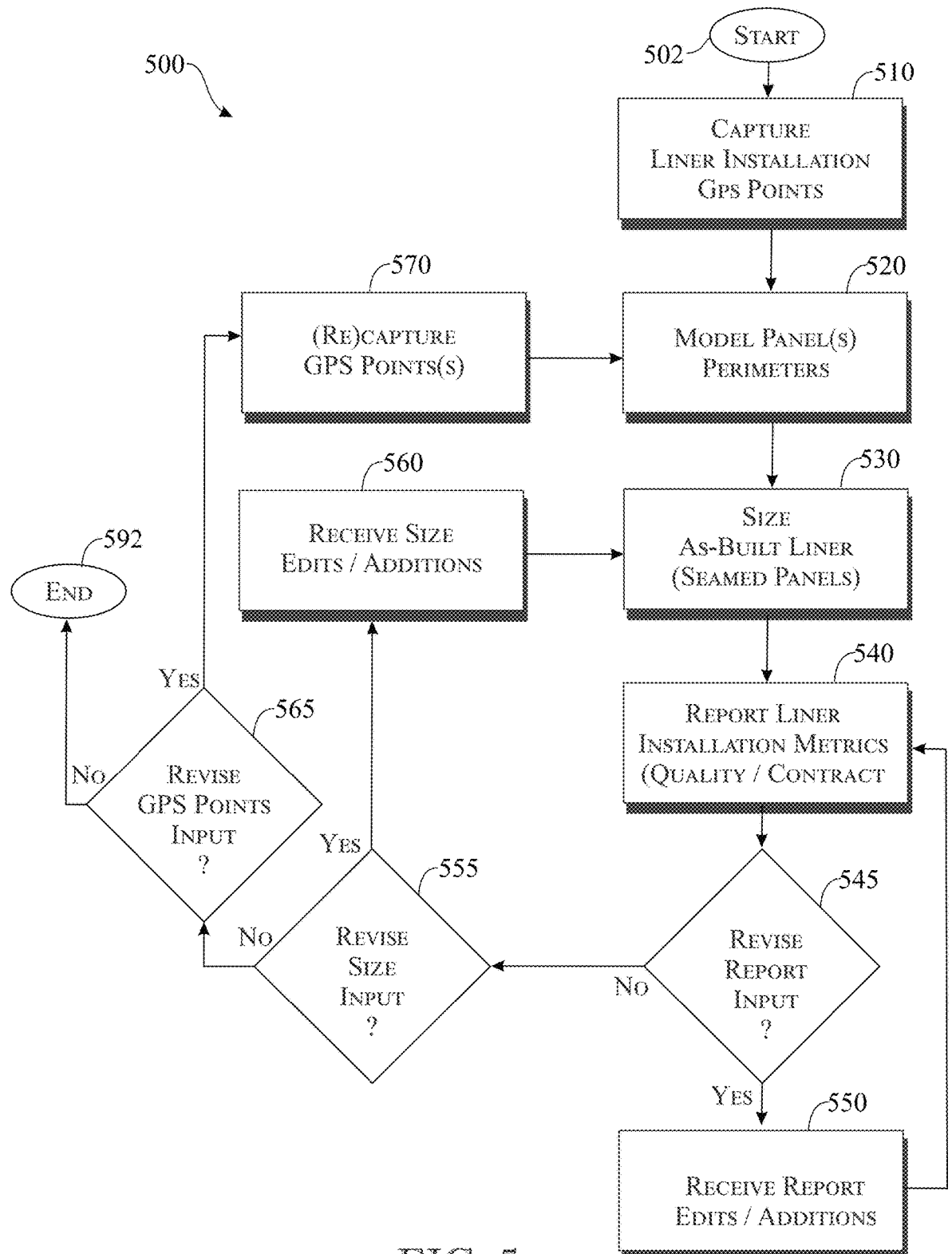
FIG. 5 presents a flowchart illustrating an exemplary geosynthetic liner seam modeling and reporting method operating in accordance with an embodiment of the present invention.

Referring now to FIG. 5, and continuing to refer to FIG. 4, a method 500 of configuring a Geosynthetic Liner Seam Modeling and Reporting System 400 for operation is illustrated in accordance with an exemplary embodiment of the present invention. In certain embodiments, the present invention may be configured, from the start at Block 502, to capture GPS points shot on geomembrane liner seams (Block 510) and to automatically create a three-dimensional as-built software model based on those GPS points (Block 520). As each GPS point is shot in a seam (for example, and without limitation, during installation of geomembrane panels), the GPS point may be tagged by an installer with identifiers for adjacent panels to each specific point. A GPS point(s) may only need to be captured along the liner seam where a change(s) in direction from a straight line is detected on the seam. For example, and without limitation, if an installed panel is configured as a perfectly flat rectangle, only the four corners of that panel need to be shot with a respective GPS point. Conversely, any other changes in contour or angle may require a separate GPS point be shot at each such change in angle or direction. After the installer has shot all the GPS points and tagged the associated adjacent panel numbers, the present invention may receive these data as input into an algorithm that may create a 3D drawing (e.g., model) of the geolocation of all the panels in a completed, as-built geomembrane structure. Exemplary implementations of the capture (Block 510) and model (Block 520) subprocesses are described hereinbelow in more detail. At Block 530, the method 500 may include sizing the seamed panels of the as-built geomembrane structure based on the captured GPS points. At Block 540, results of this sizing may be formatted as installation metrics for inclusion in industry standard reports and/or custom reports (e.g., for quality assurance and/or contract adherence purposes).

A person of skill in the art will immediately recognize that documentation of repairs in a geomembrane structure is equally important as recording the original seams in an as-built. For example, and without limitation, the point at which three or more panels come together is often characterized by a hole that must be covered at that "joint" or "junction." Also for example, and without limitation, damages incurred by a liner often need to be "patched" to achieve a seal. Installation metrics for such repairs in a geomembrane structure may be located using GPS and documented on an as-built (as described above for Blocks 510, 520, 530, and 540) and/or may be manually entered as custom metrics as described below.

An automated system 400 implementation of the exemplary method 500 may prompt a user to customize certain report contents at Block 545 (for example, and without limitation, at Block 550 report edits and/or additions such as installer name and/or inspector/approval authority name may be input for inclusion in a report). Another automated system 400 implementation of method 500 may prompt a user to manually revise the reported liner sizing results at Block 555 (for example, and without limitation, at Block 560 material sizing edits such as spare geomembrane material left with a user for future repair purposes may be input for inclusion in a report). Another automated system 400 implementation of method 500 may, at Block 565, prompt a user to revise one or more GPS points by reshooting those points (Block 570) for reintroduction into the modeling step at Block 520 (for example, and without limitation, to account for an on-site repair that may have changed or added GPS points compared to a previous report). In the event a report is completed at Block 540, and no revisions are required at Blocks 545, 555, and 565, the method 500 may end at Block 592.

Figure 6:
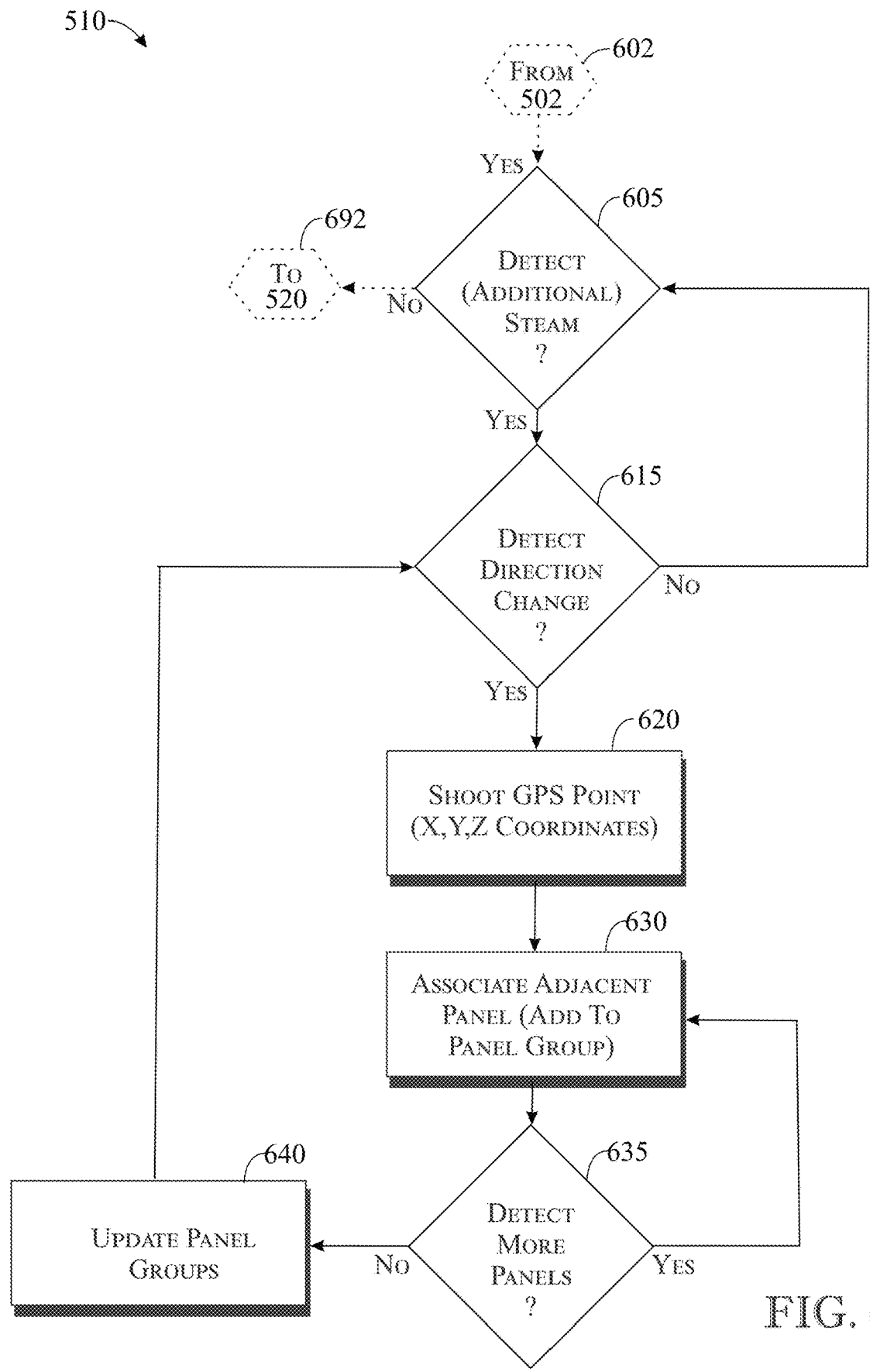
FIG. 6 presents a flowchart illustrating an exemplary Global Positioning System (GPS) capture implementation of the geosynthetic liner seam modeling and reporting method of FIG. 5.

Referring now to FIG. 6, and continuing to refer to FIGS. 4 and 5, the subprocess for capturing GPS points shot on geomembrane liner seams (Block 510) will now be discussed in more detail. From the start at Block 602, a Communication Subsystem 422 may be configured to monitor for detection (in turn) of one or more seams along an as-built geomembrane of interest (Block 605). For each seam detected, the Communication Subsystem 422 may be configured to monitor for detection of one or more direction changes in each seam (Block 615). For each direction change detected, the Communication Subsystem 422 may be configured to receive geolocation parameters associated with that direction change in the subject as-built geomembrane of interest. For example, and without limitation, such geolocation parameters may comprise global positioning system (GPS) coordinates received from a GPS service provider (e.g., Vendor Server 460) defining installation points of the subject as-built liner. Using such input, an installer may use the subprocess 510 to shoot GPS points on the liner seams of interest (Block 620) and to tag each point with an adjacent panel identifier (Block 630). At Block 635, the subprocess 510 may loop to associate additional panel identifiers (i.e., multiple adjacent panels) to the same GPS point at Block 630. For example, and without limitation, in one embodiment of the present invention, each GPS point may have between one and four associated panel identifiers.

At Block 640, GPS points may be grouped by panel identifier. For example, and without limitation, if GPS point A is tagged to be adjacent to panels 1, 2, and 4, then GPS point A may be placed in three Panel Groups: 1, 2 and 4. After looping through all the GPS points (Block 615) in all seams (Block 605) present in a geomembrane of interest, the subprocess 510 may build a list of Panel Groups (Block 640) each containing a list of GPS points that touch each specific panel.

Figure 7A:
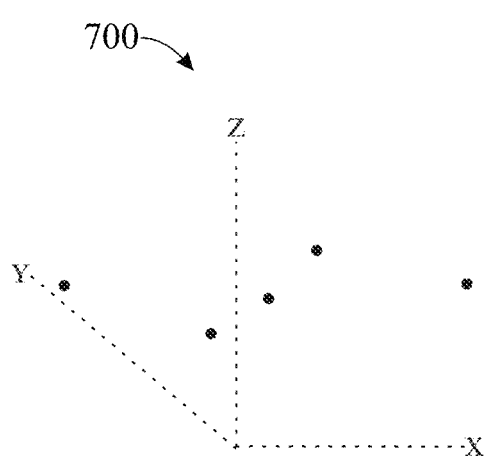
FIG. 7A presents a state diagram illustrating an initial state of an exemplary Panel Perimeter Model implementation of the geosynthetic liner seam modeling and reporting method of FIG. 5.

Referring now to FIGS. 7A, 7B, 7C, 7D, 7E, 7F, 7G and 7H, and continuing to refer to FIGS. 4 and 5, the subprocess for automatically creating a three-dimensional as-built software model based on input GPS points (Block 520) will now be discussed in more detail. The Quantification Subsystem 424 may be configured to create, for each Panel Group of GPS points, an ordered list of GPS points in counterclockwise order to facilitate drawing of each panel in an xyz coordinate plane in a "connect the dots" fashion. For example, and without limitation, an exemplary set of input GPS points 700 for a panel of interest is illustrated in FIG. 7A.

Figure 7B:
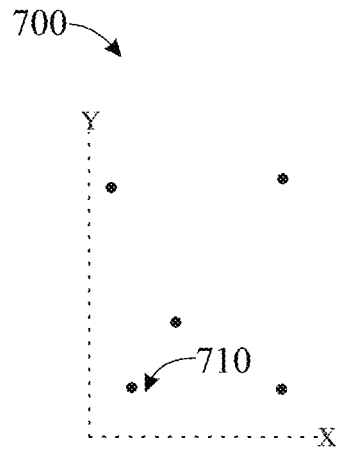
Figure 7C:
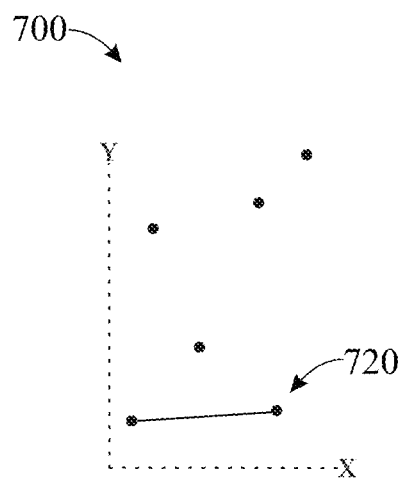
Figure 7D:
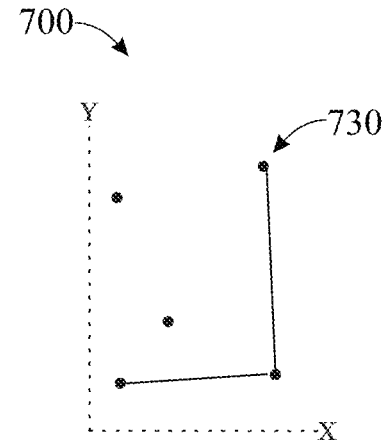

As illustrated in FIG. 7B, the subprocess 520 may be configured to first flatten each GPS point to a two-dimensional plane, temporarily removing the z value (elevation). Then the subprocess 520 may operate to identify the point 710 with the lowest y value. Using this lowest y value point 710, the subprocess 520 may calculate the angle from that origin point 710 with respect to the x axis to all other GPS points in the illustrated Panel Group. As illustrated in FIG. 7C, the smallest angle detected by the subprocess 520 may identify the next point 720 with which the origin point 710 may connect to form a segment of the panel to be modeled. Subprocess 520 may continue this angular calculation on each subsequent point (e.g., as illustrated in FIG. 7D to identify point 730, in FIG. 7E to identify point 740, and in FIG. 7F to identify the original point 710 by the lowest remaining angle).

As illustrated in FIG. 7F, the subprocess 520 may have calculated a perimeter around points 710, 720, 730, and 740 in counterclockwise order, but may not have accounted for any potential points internal to this perimeter (e.g., concave points). The present subprocess 520 may guarantee establishment of a perimeter around the outside of a panel of interest (analogous to a string wrapped around a group of nails, with the possibly that additional nails may be positioned on the inside of the grouping that the string does not yet touch). To address such occurrences, for each remaining interior point that is not attached to the perimeter, the subprocess 520 may calculate a distance from a non-perimeter point to each segment drawn. Then, for the point that has the smallest distance to any line segment, the subprocess 520 may splice that point into that specific line segment and reconnect the two points from the original segment. For example, and without limitation, FIG. 7G illustrates how point 750 may be spliced in to replace the original (nearest) segment between points 710 and 740. Subprocess 520 may repeat this step until all non-perimeter points in a panel of interest are spliced in 760.

After all GPS points in a Panel Group are accounted for, subprocess 520 may add back in the respective z values to all GPS points, resulting in an ordered list of GPS points for the given panel in counterclockwise order. As illustrated in FIG. 7H, the as-built software model 770 may now be drawn since the GPS points are now ordered in counterclockwise order around the panel.

As summarized above for Block 530 of FIG. 5, the Quantification Subsystem 424 may size this as-built software model (e.g., seam lengths may be calculated using the Pythagorean theorem to get line distance; and panel area may be calculated by triangulating the panel surface, finding the area of each triangle within the panel, and then summing these areas).

Referring again to FIG. 4, the system 400 may employ a cloud-based database to centralize all local field reporting. For example, and without limitation, the Reporting Subsystem 426 may be configured to search the cloud database to identify various metrics across all geomembrane installation projects. Using date range, material type, superintendent, equipment operator, and machine number as parameters, the Reporting Subsystem 426 may be configured to generate documentation of several different report types, including Destruct Fail/Pass Rate, Preweld Fail/Pass Rate, Linear Foot (LF) Welded Fusion, LF Welded Extrusion, Square Feet (SF) Deployed, Repair Type Percent, Waste Percent, and Percent Complete. Such queries on this centralized database may advantageously identify the most and least productive superintendents, operators, and equipment; as well as the equipment and operators that produce the most preweld/destruct failures and successes.

In another embodiment of the present invention, the subprocess for capturing GPS points shot on geomembrane liner seams (Block 510 of FIG. 5) may be configured to create all the seam number combinations solely based on GPS points shot on the seams with metadata attached to each GPS point that stores the adjacent panel identifiers. For example, and without limitation, subprocess 510 may employ a treemap reduce algorithm to generate a unique list of seam number pairs based on the same GPS points with the adjacent panel metadata to be used to generate the as-built software model. As defined herein, a treemap refers to data model represented in a hierarchical format characterized by nodes. Each node is a key/value pair, and duplicate keys are not allowed. Because treemaps exhibit logarithmic (O(Log in)) insertion and lookup times and are ordered, these data structures are useful for searching and manipulating large datasets.

Figure 8:
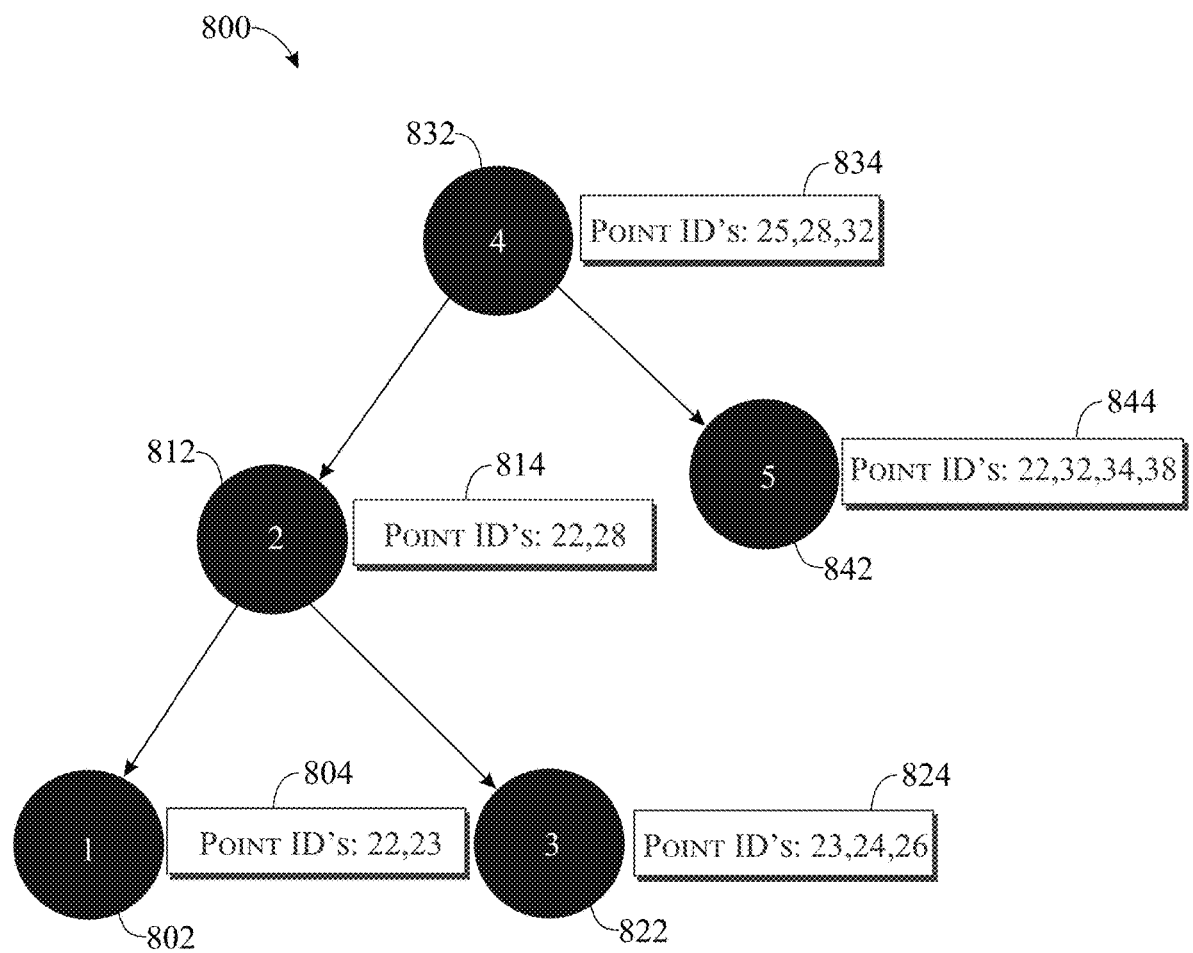
FIG. 8 presents a schematic diagram of an exemplary treemap data structure of a geosynthetic liner seam modeling and reporting system according to an embodiment of the present invention.

Referring to FIG. 8, an exemplary treemap data structure 800 will now be discussed in detail. As illustrated, for example, and without limitation, Panel Numbers may be represented as the nodes 802, 812, 822, 832, 842 on the treemap 800. Also as illustrated, for example, and without limitation, the values may be represented as respective arrays 804, 814, 824, 834, 844 of GPS Point identifiers that touch each Panel 802, 812, 822, 832, 842. If a duplicate panel exists, the subprocess 510 may add the GPS Point identifier to the value part in the node.

Figure 9:
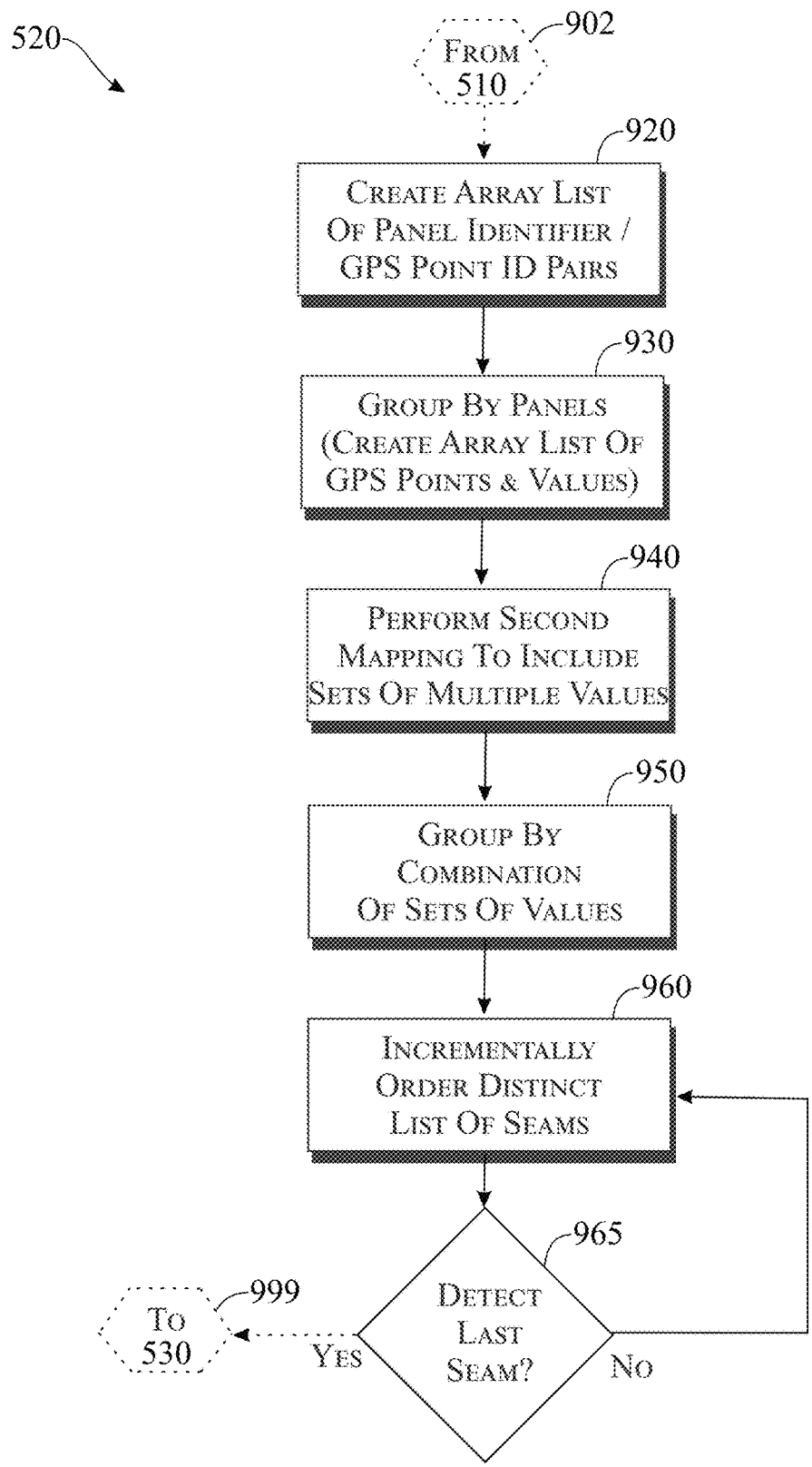
FIG. 9 presents a flowchart illustrating an exemplary Panel Perimeter Model implementation of the geosynthetic liner seam modeling and reporting method of FIG. 5.

More specifically, using a GPS service system as described above, and also as illustrated in the exemplary method aspect of FIG. 9, subprocess 520 may shoot GPS points on the liner seams and, with each point, may tag adjacent panel identifiers. From the start at Block 902, for example, and without limitation, each GPS point may have between 1 and 4 associated panel identifiers. At Block 920, subprocess 520 may create an array list of all Panel identifier/GPS Point identifier pairs. For example, and without limitation, if GPS Point A is tagged to be adjacent to panels 1, 3, and 4, then subprocess 520 may create the pairs (4, A), (3, A), and (1, A) and may store each pair individually in a list ordered by panel number. Similarly, if GPS Point ID #10 is tagged for Panels 1, 2, 3, and 4, the first four pairs in the Array List may be stored by subprocess 520 as (Panel 1, Point ID 10), (Panel 2, Point ID 10), (Panel 3, Point ID 10), and (Panel 4, Point ID 10).

Subprocess 520 may then reduce the sets by creating a treemap using Panel identifier as the key, and a list of GPS Point identifiers that touch the panel as the values (Block 930). That is, grouping of panels present may be accomplished using the treemap to record Panel Numbers as the nodes, and a respective Array List of GPS Point IDs and their values at each node. As described above, a treemap data structure may advantageously ensure that the Array List will be ordered, that duplicate entries may be ignored, and that insertion and lookup of values may occur quickly with a large dataset.

At Block 940, subprocess 520 may then accomplish a second mapping, this time using GPS Point identifier pairs as the key and Panel identifiers as the value. Subprocess 520 may include only sets that have two or more GPS Point identifier's in the treemap. For example, and without limitation, subprocess 520 may iterate through the treemap, building an Array List of all possible Panel Groups (wherein a Panel Group is defined as a GPS Point ID pair, with a Panel). For example, a treemap Panel node with two (2) GPS Point IDs may have one (1) Panel Group. Continuing, a treemap Panel node with three (3) GPS Point IDs may have three (3) Panel Groups (for example, say Panel 2 comprises GPS Point IDs 4, 5, and 6; in this case, Panel Groups (i.e., all Possible GPS Point ID pairs and Panel Number) are ((4,5), 2), ((4,6, 2), and ((5,6), 2)). Still continuing, a treemap panel node with four (4) GPS Point IDs may have eight (8) Panel Groups, and so on.

At Block 950, subprocess 520 may reduce again by grouping by combination of sets (if GPS Point identifier Pair sets match, then it is a seam x/v). Subprocess 520 may ignore duplicates as they are outside seams, or just redundant pairs. Again employing the treemap here, and using GPS Point ID as the key and an Array List of panels as the value, if subprocess 520 detects a matching GPS Point ID pair, that algorithm 520 may append that panel to the value on the node (thereby positively identifying a seam).

At Block 960, subprocess 520 may reduce one last time by grabbing only a distinct list of seams, using a treeset (defined as two Panel identifiers that make up a seam as the key), and ordering them starting with the lowest seam. For example, and without limitation, subprocess 920 may iterate through the above treemap and, if there are two panels in the value portion of the treemap, then a seam is positively identified. In so using a treeset, subprocess 520 may advantageously ignore duplicates and also order the seams from the first (for example, usually seam ½) to the last (as detected at Block 965). Upon processing of the last seam, subprocess 520 may end at Block 999.

In some embodiments the method or methods described above may be executed or carried out by a computing system including a tangible computer-readable storage medium, also described herein as a storage machine, that holds machine-readable instructions executable by a logic machine (i.e. a processor or programmable control device) to provide, implement, perform, and/or enact the above described methods, processes and/or tasks. When such methods and processes are implemented, the state of the storage machine may be changed to hold different data. For example, the storage machine may include memory devices such as various hard disk drives, CD, or DVD devices. The logic machine may execute machine-readable instructions via one or more physical information and/or logic processing devices. For example, the logic machine may be configured to execute instructions to perform tasks for a computer program. The logic machine may include one or more processors to execute the machine-readable instructions. The computing system may include a display subsystem to display a graphical user interface (GUI) or any visual element of the methods or processes described above. For example, the display subsystem, storage machine, and logic machine may be integrated such that the above method may be executed while visual elements of the disclosed system and/or method are displayed on a display screen for user consumption. The computing system may include an input subsystem that receives user input. The input subsystem may be configured to connect to and receive input from devices such as a mouse, keyboard or gaming controller. For example, a user input may indicate a request that certain task is to be executed by the computing system, such as requesting the computing system to display any of the above described information or requesting that the user input updates or modifies existing stored information for processing. A communication subsystem may allow the methods described above to be executed or provided over a computer network. For example, the communication subsystem may be configured to enable the computing system to communicate with a plurality of personal computing devices. The communication subsystem may include wired and/or wireless communication devices to facilitate networked communication. The described methods or processes may be executed, provided, or implemented for a user or one or more computing devices via a computer-program product such as via an application programming interface (API).

As a non-limiting example, the disclosure teaches action by a processor to execute a "determining step" that cannot be done mentally, for example by determining any of the disclosed data, informatic values, or states by automatically tracking other data, informatic values, or states. For example, the disclosed systems and methods may automatically determine a second (dependent) state or value by automatically tracking a first (independent) state or value, the second state automatically depending on the first state.

The disclosure includes the practical application of a processor (logic machine), and this practical application may include the receiving of an input through a graphical user interface (GUI) such as a user selection to execute one or more tasks or operations. Such a practical application may include the automatic operation of one or more data- or state-determining tasks in response to such a user selection or user input. The practical application as such may automatically execute any of the herein operations based on automatically determining any of the disclosed values, data, informatics, or states.

It is to be understood that the disclosed systems and methods provide a specific manner of automatically executing or actualizing the disclosed tasks, operations, or methods in a manner that is an improvement over known systems and solutions. In addition to being a practical application of machines, the disclosure includes an inventive concept that is not anticipated or obvious in view of known systems and methods.

Furthermore, the systems and methods disclosed herein are configured to solve technical problems in computing in the field of the disclosure as set forth in the background section, where the problems have attributes that hinder, limit, and/or prevent the features, aspects, or elements disclosed herein from being enabled and/or implemented. Therefore the disclosed technical solutions eliminate or alleviate these problems and positively contribute to the technical abilities of existing computing systems and methods.

As a non-limiting example of such a practical application, embodiments of the invention may include a system, a method, and/or a computer program product. The computer program product may include a computer readable storage medium (or media) having computer readable program instructions thereon for causing a processor to carry out aspects of the invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on one or more standalone computers, partly on one or more standalone computers, as a stand-alone software package, partly on one or more standalone computers and partly on one or more remote computers, partly on one or more standalone computers and partly on one or more distributed computing environments (such as a cloud environment), partly on one or more remote computers and partly on one or more distributed computing environments, entirely on one or more remote computers or servers, or entirely on one or more distributed computing environments. Standalone computers, remote computers, and distributed computing environments may be connected to each other through any type of network or combination of networks, including local area networks (LANs), wide area networks (WANs), through the Internet (for example using an Internet Service Provider), or the connection may be made to external computers. In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the invention.

Aspects of the invention are described herein with reference to schematic flowchart illustrations and/or block diagrams of methods, apparatus (systems), functions, and computer program products according to embodiments of the invention. It will be understood that each block of the flowchart illustrations and/or block diagrams, and combinations of blocks in the flowchart illustrations and/or block diagrams or functions, can be implemented by computer readable program instructions. Functions, including policy functions, are groups of computer readable program instructions grouped together that can be invoked to complete one or more tasks.

These computer readable program instructions may be provided to one or more processors of one or more general purpose computers, special purpose computer, or other programmable data processing apparatus to produce a machine, such that the instructions, which execute via the processors of the one or more computers or other programmable data processing apparatus, create means for implementing the functions/acts specified in the flowchart and/or block diagram block or blocks. These computer readable program instructions may also be stored in one or more computer readable storage mediums that can direct one or more computers, programmable data processing apparatuses, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto one or more computers, other programmable data processing apparatus, or other devices to cause a series of operational steps to be performed on the one or more computers, other programmable apparatuses or other device to produce a computer implemented process, such that the instructions which execute on the computers, other programmable apparatus, or other devices implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Since many modifications, variations, and changes in detail can be made to the described preferred embodiments of the invention, it is intended that all matters in the foregoing description and shown in the accompanying drawings be interpreted as illustrative and not in a limiting sense. Furthermore, it is understood that any of the features presented in the embodiments may be integrated into any of the other embodiments unless explicitly stated otherwise. The scope of the invention should be determined by the appended claims and their legal equivalents.

What is claimed is:

1. A geosynthetic liner seam monitoring and reporting system comprising:
   a GPS (global positioning system) enabled device, the GPS enabled device used to capture a plurality of GPS point shots wherein each GPS point shot comprises (i) GPS points along seams of a multiple-panel, seam-welded, field installed geosynthetic liner and (ii) a plurality of geolocation parameters specific to each GPS point captured along a particular seam, the plurality of parameters comprising at least a point identification (ID) an attribute description, one or more attribute numbers specific to the attribute description, a layer, one or more panel numbers, a time, and a date;
   one or more processors and memory running a computer program product that when executed, cause the one or more processors to perform operations comprising:
   receives the plurality of GPS point shots captured together with the GPS points captured and the plurality of geolocation parameters specific to each captured GPS point associated with each GPS shot;
   creates from the plurality of GPS shots and their associated panels a three-dimensional as-built model of the multiple-panel, seam-welded, field installed geosynthetic liner by performing for each GPS shot received:
   associates the one or more geolocation parameters to one or more adjacent panels of the geosynthetic liner;

creates, using one or more of the geolocation parameters, one or more Panel Groups of GPS points;

creates, for each of the Panel Groups of GPS points, an ordered list of GPS points in counterclockwise order to facilitate drawing of each panel in an xyz coordinate plane by flattening each GPS point to a two-dimensional plane by temporarily removing a z value (elevation);

identifies a GPS point with a lowest y value, defined as an origin point;

determines a smallest angle from the origin point with respect to an x axis to all other GPS points in the Panel Group, in turn, to form among all GPS points respective segments of a panel of the one or more Panel Groups to be modeled, defined as a perimeter;

determines, for any GPS point not attached to the perimeter, defined as a respective non-perimeter point, a distance from the non-perimeter point to each nearest segment drawn; and creates a report including the three-dimensional as-built model of the multiple-panel, seam-welded, field installed geosynthetic liner; and reports, to one or more individuals associated with the geosynthetic liner seam monitoring and reporting system, documentation of at least one of: the three-dimensional as-built model, a repair status, seam weld fail/pass rate, seam preweld fail/pass rate, linear foot welded fusion, welded extrusion, square feet deployed, repair type percent, waste percent, or percent complete.

2. A geosynthetic liner seam monitoring and reporting system comprising:

a GPS (global positioning system) enabled device, the GPS enabled device used to capture a plurality of GPS point shots wherein each GPS point shot comprises (i) GPS points along seams of a multiple-panel, seam-welded, field installed geosynthetic liner; and (ii) a plurality of geolocation parameters specific to each GPS point captured along a particular seam, the plurality of parameters comprising at least a point identification (ID), an attribute description, one or more attribute numbers specific to the attribute description, a layer, one or more panel numbers, a time, and a date;

one or more processors and memory running a computer program product that when executed, cause the one or more processors to perform operations comprising:

receives the plurality of GPS point shots captured together with the GPS points captured and the plurality of geolocation parameters specific to each captured GPS point associated with each GPS shot;

creates from the plurality of GPS shots and their associated panels a three-dimensional as-built model of the multiple-panel, seam-welded, field installed geosynthetic liner by performing for each GPS shot received:

associates the one or more GPS based geolocation parameters to one or more adjacent panels of the geosynthetic liner;

creates, using one or more of the GPS based geolocation parameters, one or more Panel Groups of GPS points;

creates, for each of the Panel Groups of GPS points, an ordered list of GPS points in counterclockwise order to facilitate drawing of each panel in an xyz coordinate plane by flattening each GPS point to a two-dimensional plane by temporarily removing a z value (elevation);

identifies a GPS point with a lowest y value, defined as an origin point;

determines a smallest angle from the origin point with respect to an x axis to all other GPS points in the Panel Group, in turn, to form among all GPS points respective segments of a panel of the one or more Panel Groups to be modeled, defined as a perimeter;

determines, for any GPS point not attached to the perimeter, defined as a respective non-perimeter point, a distance from the non-perimeter point to each nearest segment drawn;

splicing, for a respective non-perimeter point that has a smallest distance to a nearest respective line segment, that respective non-perimeter point into the nearest respective line segment and reconnecting the respective non-perimeter point associated with the nearest respective line segment;

reintroducing respective z values to all GPS points for the panel of the one or more Panel Groups to be modeled, resulting in an ordered list of GPS points for the panel of the one or more Panel Groups to be modeled in counterclockwise order; and creates a report including the three-dimensional as-built model of the multiple-panel, seam-welded, field installed geosynthetic liner; and reports, to one or more individuals associated with the geosynthetic liner seam monitoring and reporting system, documentation of at least one of: the three-dimensional as-built model, a repair status, seam weld fail/pass rate, seam preweld fail/pass rate, linear foot welded fusion, welded extrusion, square feet deployed, repair type percent, waste percent, or percent complete.

3. The geosynthetic liner seam monitoring and reporting system of claim 2, further comprising, generating the three-dimensional as-built model as the linear seams are installed.

4. The geosynthetic liner seam monitoring and reporting system of claim 3, wherein generating the three-dimensional as-built model of a multiple-panel, seam-welded field installed geosynthetic liner comprises tagging each of the Panel Groups of GPS points with panel identifiers, as meta data.

5. The geosynthetic liner seam monitoring and reporting system of claim 4, wherein generating the three-dimensional as-built model of the geosynthetic liner comprises generating an array list of the panel identifiers and matched data pairs linking each of the panel identifiers with each of the Panel Groups of GPS points, defining the matched data pairs.

6. The geosynthetic liner seam monitoring and reporting system of claim 5, wherein generating the three-dimensional as-built model of the geosynthetic liner comprises ordering the ordered list of GPS points by the panel identifiers.

7. The geosynthetic liner seam monitoring and reporting system of claim 6, wherein generating the three-dimensional as-built model of the geosynthetic liner comprises creating a first treemap using the panel identifiers as a key.

8. The geosynthetic liner seam monitoring and reporting system of claim 7, wherein generating the three-dimensional as-built model of the geosynthetic liner comprises creating a second treemap using the matched data pairs as a key only including the matched data pairs with two or more GPS points in the second treemap.

9. The geosynthetic liner seam monitoring and reporting system of claim 8, wherein generating the three-dimensional as-built model of the geosynthetic liner comprises generating the three-dimensional as-built model using the first treemap and the second treemap.

* * * * *